(12) United States Patent
Aichi et al.

(10) Patent No.: US 7,317,505 B2
(45) Date of Patent: Jan. 8, 2008

(54) EXPOSURE APPARATUS AND DEVICE MANUFACTURING METHOD

(75) Inventors: Shintaro Aichi, Utsunomiya (JP); Makoto Nomoto, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/981,777

(22) Filed: Nov. 5, 2004

(65) Prior Publication Data
US 2005/0110968 A1    May 26, 2005

(30) Foreign Application Priority Data
Nov. 7, 2003    (JP) .............................. 2003-377657

(51) Int. Cl.
G03B 27/52    (2006.01)
G03B 27/42    (2006.01)
G03B 27/32    (2006.01)

(52) U.S. Cl. .............................. 355/30; 355/53; 355/77
(58) Field of Classification Search .................. 355/30, 355/53; 359/228, 507, 509
See application file for complete search history.

(56) References Cited

U.S. PATENT DOCUMENTS

| | | | | |
|---|---|---|---|---|
| 4,704,348 A | * | 11/1987 | Koizumi et al. ............ | 430/327 |
| 4,786,947 A | * | 11/1988 | Kosugi et al. ................ | 355/30 |
| 4,825,247 A | * | 4/1989 | Kemi et al. ................... | 355/55 |
| 5,892,572 A | * | 4/1999 | Nishi .......................... | 355/67 |
| 6,545,746 B1 | * | 4/2003 | Nishi .......................... | 355/53 |
| 2001/0055326 A1 | * | 12/2001 | Miwa et al. .................. | 372/57 |
| 2002/0027645 A1 | * | 3/2002 | Shiraishi ...................... | 355/30 |
| 2002/0036760 A1 | * | 3/2002 | Udagawa et al. ............. | 355/53 |
| 2002/0050572 A1 | * | 5/2002 | Nagahashi et al. ...... | 250/492.1 |
| 2002/0145711 A1 | * | 10/2002 | Magome et al. .............. | 355/30 |
| 2004/0182565 A1 | * | 9/2004 | Nomoto ...................... | 165/275 |

FOREIGN PATENT DOCUMENTS

| | | |
|---|---|---|
| JP | 2000-315640 | 11/2000 |
| JP | 2003-14239 | 1/2003 |

\* cited by examiner

*Primary Examiner*—Alan Mathews
(74) *Attorney, Agent, or Firm*—Fitzpatrick, Cella, Harper & Scinto

(57) ABSTRACT

An exposure apparatus having a projection optical system and configured to expose a substrate to light via a pattern of a mask and the projection optical system. The apparatus includes a chamber to hermetically contain at least part of the projection optical system, and a circulating system to send an inert gas to the chamber. A controller controls a temperature regulator on the basis of a target temperature in the chamber and a detection result of a temperature sensor. The controller changes the target temperature so that a timewise temperature gradient of the inert gas falls within an acceptable range. The acceptable range is determined so that a timewise change in pressure in the chamber caused by a timewise change in temperature of the inert gas is within an acceptable range.

6 Claims, 6 Drawing Sheets

EXPOSURE APPARATUS AND DEVICE MANUFACTURING METHOD

FIELD OF THE INVENTION AND RELATED ART

The present invention relates to an exposure apparatus and a device manufacturing method.

A shorter wavelength of exposure light from a light source of an exposure apparatus for use in semiconductor manufacturing, or the like, has progressed as a finer exposure pattern is used. More specifically, the light source has been shifted from that for an i-ray to an excimer laser, and its laser light source has been shifted from a KrF laser to an ArF laser. At present, the use of the $F_2$ laser is studied in order to satisfy the requirement for further fine patterning.

In order to construct an exposure system using the $F_2$ laser as the light source, it is necessary to take a countermeasure against energy attenuation of exposure light. Energy of an $F_2$ laser light is absorbed by moisture, oxygen, organic gas, and so on, in atmospheric air, so that a conventional exposure apparatus cannot be applied as it is.

For this reason, as a means for bringing the exposure apparatus into correspondence with the $F_2$ laser, it is possible to apply such a method that the entire space through which exposure light passes is hermetically sealed by a partition wall and is filled with inert gas such as nitrogen, etc. Further, there is a large amount of heat, generated by a linear motor, or the like, for a stage, in a space in which a wafer and a reticle are disposed, so that the space requires a temperature-control circulating system of inert gas for the purpose of preventing a change in temperature in the space in order to retain a positional accuracy.

FIG. 5 is a schematic view showing a conventional inert gas circulating system.

As shown in FIG. 5, a wafer space 1 and a reticle space 2 are surrounded by a chamber 3W and a chamber 3R, respectively. The inside of the chamber 3 (3R, 3W) is a closed space. Each of the spaces 1 and 2 is provided with a temperature-control gas blowoff portion 4 and a temperature-control gas recovery portion 5.

In order to circulate inert gas, which is subjected to temperature control and contaminant removal in the chamber 3, the inert gas circulating system is provided with a circulating apparatus 6, which is connected with the gas blowoff portion 4 through a supply duct 7 and the gas recovery portion 5 through a return duct 8, respectively. The circulating apparatus 6 includes a cooling device 9, a blower 10, a filter 11, and a heating device 12, in this order, in an inert gas flowing direction.

The inert gas recovered through the return duct 8 from the inside of the wafer space 1 and the reticle space 2 has absorbed heat generated in the wafer space 1 and the reticle space 2, so that it is subjected to heat exchange with a cooling medium by the cooling device 9. The cooled inert gas is sent to the filter to be subjected to removal of contaminants. The filter 11 may include a chemical filter for removing ammonia rich in resist reactivity, an activated carbon filter for removing, e.g., siloxane or other organic gases, an ULPA filter for removing particles, etc. The inert gas, which has been subjected to cooling on contaminant removal is further subjected to temperature control (heating) by heating with the heating device 12 and is circulated to the gas blowoff portion 4. A power source for fluid transfer by the circulation is the blower 10.

During the circulation, high-purity inert gas is supplied into the wafer space 1 and the reticle space 2 to maintain a concentration of the inert gas in the wafer space 1 and the reticle space 2. Further, a predetermined amount of gas is exhausted from an exhaust valve 14 through a throttle valve, whereby an internal pressure of the wafer space 1 and the reticle space 2 is set to be higher than an outside atmospheric pressure to prevent an entrance of outside air.

The temperature control of the inert gas is performed by detecting the inert gas temperature by a temperature sensor 16, inputting a resultant signal into a temperature controller 17, and adjusting an output of the heating device 12 through PID feedback control.

Japanese Laid-Open Patent Application (JP-A) No. 2003-14239, filed by the assignee of the present application, discloses a temperature-controlled fluid supplying apparatus having such a structure that a fluid supplying pipe for supplying a temperature-controlled fluid to an object to be temperature-controlled and a heat-exchange fluid pipe for supplying a heat-exchange fluid, which is heat-exchanged with the temperature-controlled fluid, are partially contacted closest to each other.

Further, JP-A No. 2000-315640, filed by the assignee of the present invention, discloses an exposure apparatus including an air state quantity detecting means comprising a means for detecting at least a temperature as a stage quantity of air to be supplied to a main body of the exposure apparatus, a thermal capacity of the air from the state quantity of the air detected by the air state quantity detecting means, a temperature control parameter calculation means for calculating a temperature control parameter on the basis of the thermal capacity value of the air calculated by the thermal capacity calculation means, the air temperature detected by the air state quantity detecting means, and a target temperature, and a temperature control device for temperature-controlling the temperature of the air on the basis of the temperature control parameter calculated by the parameter calculation means.

During a start of an operation of an inert gas circulation system, when a temperature control heater is actuated after a circulation blower is actuated, it was confirmed that an internal pressure of a purge jumper fluctuates largely. This internal pressure fluctuation was also confirmed similarly during operation termination. Further, it was clarified that the internal pressure fluctuation was caused to occur in the case wherein a circulation gas was rapidly cooled by a cooling device at power-off of the temperature control heater. In addition, a unit, such as a projection lens, or the like, in a chamber has a pressure-resistant range, so that an upper-limit pressure and a lower-limit pressure are determined. Accordingly, there is a possibility that equipment, such as a lens, which is sensitive to pressure, is damaged by the above-described pressure fluctuation.

SUMMARY OF THE INVENTION

The present invention has been accomplished in view of the above-described problem.

An exemplary object of the present invention is to provide an exposure apparatus with high reliability.

According to an aspect of the present invention, there is provided an exposure apparatus for projecting a pattern of an original onto a substrate, the apparatus comprising:

a chamber comprising at least a part of an optical element, and a circulating system for circulating a gas, which is temperature-controlled, through the chamber, wherein the circulating system comprises:

(i) a unit for effecting at least one of heating and cooling of the gas, and (ii) a control system for changing an operation state of the unit so as to limit a timewise changing rate of a temperature in the chamber.

Based on the exposure apparatus described above, the present invention provides a high-reliability exposure apparatus.

These and other objects, features and advantages of the present invention will become more apparent upon a consideration of the following description of the preferred embodiments of the present invention taken in conjunction with the accompanying drawings.

DETAILED DESCRIPTION OF THE PREFERRED EMBODIMENTS

Figure 1:
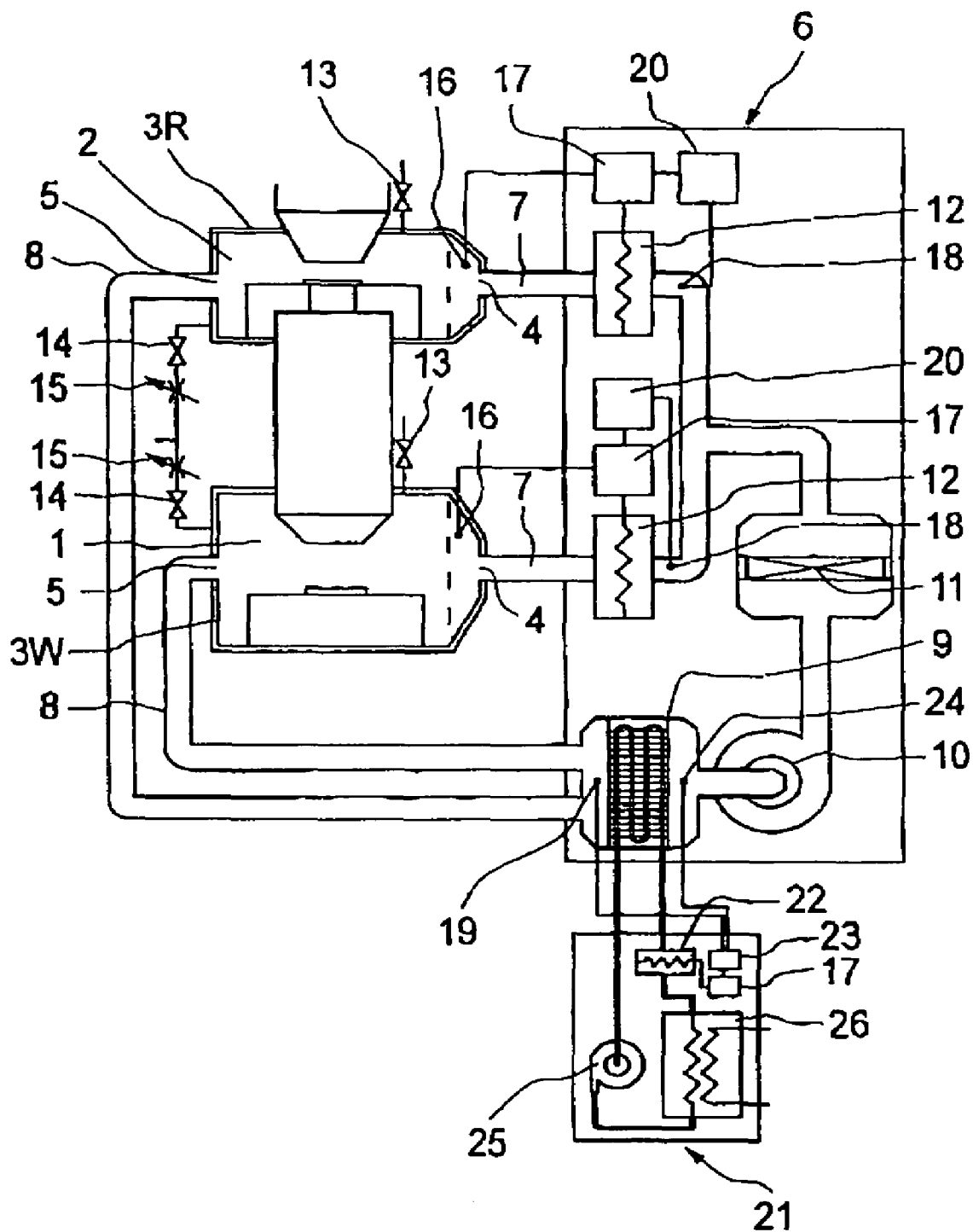
FIG. 1 is a schematic view of an embodiment of the exposure apparatus according to the present invention.

An exposure apparatus according to a first preferred embodiment of the present invention includes a gastight chamber, and an air conditioning means for effecting temperature control and cleanup in the gastight chamber by use of a blower for circulating inert gas to the gastight chamber, a cooling device for cooling the inert gas, a heating device for heating the inert gas, a filter for removing a contaminant from the inert gas, and a sensor disposed at a predetermined position of an inert gas circulating system comprising the gastight chamber, the blower, the cooling device, the heating device, and the filter. The exposure apparatus is characterized in that it is provided with a gradient control mechanism capable of controlling a rate of temperature rise of the heating device up to a target set temperature in order to prevent a lens breakage due to a change (fluctuation) in internal pressure of the gastight chamber.

The control mechanism is characterized in that it has a temperature sensor at an upstream portion of the heating device in the circulating system and can detect a difference between a circulation temperature and a target set temperature to determine a temperature rising rate gradient on the basis of a rise in temperature per unit time determined by volume and flow rate in order to prevent the lens breakage due to the change in internal pressure of the gastight chamber.

An exposure apparatus according to a second preferred embodiment of the present invention includes a gastight chamber, and an air conditioning means for effecting temperature control and cleanup in the gastight chamber by use of a blower for circulating inert gas to the gastight chamber, a cooling device for cooling the inert gas, a heating device for heating the inert gas, a filter for removing a contaminant from the inert gas, and a sensor disposed at a predetermined position of an inert gas circulating system comprising the gastight chamber, the blower, the cooling device, the heating device, and the filter. The exposure apparatus is characterized in that it is provided with a gradient control mechanism provided with a chiller comprising a heater for a coolant and a temperature control device, capable of controlling a cooling rate of the cooling device down to a target set temperature in order to prevent a lens breakage due to a change (fluctuation) in internal pressure of the gastight chamber.

The control mechanism in this (second) embodiment is characterized in that it has temperature sensors at upstream and downstream portions of the cooling device in the circulating system and can detect a difference between a circulation temperature and a target set temperature to determine a cooling rate gradient in order to prevent the lens breakage due to the change in internal pressure of the gastight chamber.

Further, as a cooling rate control mechanism, the gradient control mechanism is provided with a control mechanism of the number of revolutions of a pump in the chiller, whereby flow rate control of the coolant is effected to control the cooling rate of the cooling device in order to prevent the lens breakage due the internal pressure change of the gastight chamber.

An exposure apparatus according to a third preferred embodiment of the present invention includes a gastight chamber, and an air condition means for effecting temperature control and cleanup in the gastight chamber by use of a blower for circulating inert gas to the gastight chamber, a cooling device for cooling the inert gas, a temperature control heater for heating the inert gas, a filter for removing a contaminant from the inert gas, and a sensor disposed at a predetermined position of an inert gas circulating system comprising the gastight chamber, the blower, the cooling device, the temperature control heater, and the filter. The exposure apparatus is characterized in that it is provided with a gradient control mechanism capable of controlling a rate of temperature rise of the temperature control heater up to a target set temperature and a cooling rate of the cooling device down to a target set temperature, in order to prevent lens breakage due to a change (fluctuation) in internal pressure of the gastight chamber.

The control mechanism in this (third) embodiment is characterized in that it has a temperature sensor at an upstream portion of the temperature control heater in the gas circulating system. Further, a heater for a coolant (cooling medium), a temperature control device, and a gradient control mechanism are provided in the chiller as a mechanism capable of controlling a cooling rate of the cooling device, and temperature sensors are disposed at upstream and downstream portions of the cooling device, whereby gradient control is effected by detecting a difference between a circulation internal temperature and a set temperature to permit suppression of an internal pressure change of a purge chamber occurring during a start and a stop of a circulation operation within a pressure-resistant range of the lens.

Further, as a control mechanism of the cooling rate, a control mechanism of the number of revolutions of a pump is provided in the chiller, whereby flow rate control of the coolant is effected to control a cooling rate gradient of the cooling device in order to prevent the breakage of a lens due to the internal pressure change of the gastight chamber.

According to the first to third preferred embodiments described above, the internal pressure change of the purge chamber which can occur by a rapid increase and/or decrease in temperature of the circulation gas during a circulating operation start and/or a stop is suppressed to effect gradient control of a temperature rise rate and cooling rate while monitoring the circulation temperature in the purge chamber. As a result, it becomes possible to realize ensuring of the internal pressure change within a pressure-resistant range of the lens.

Herein, below, the present invention will be described in detail based on the same specific embodiments.

Embodiment 1

FIG. 1 is a schematic view of an exposure apparatus in this embodiment according to the present invention.

Figure 5:
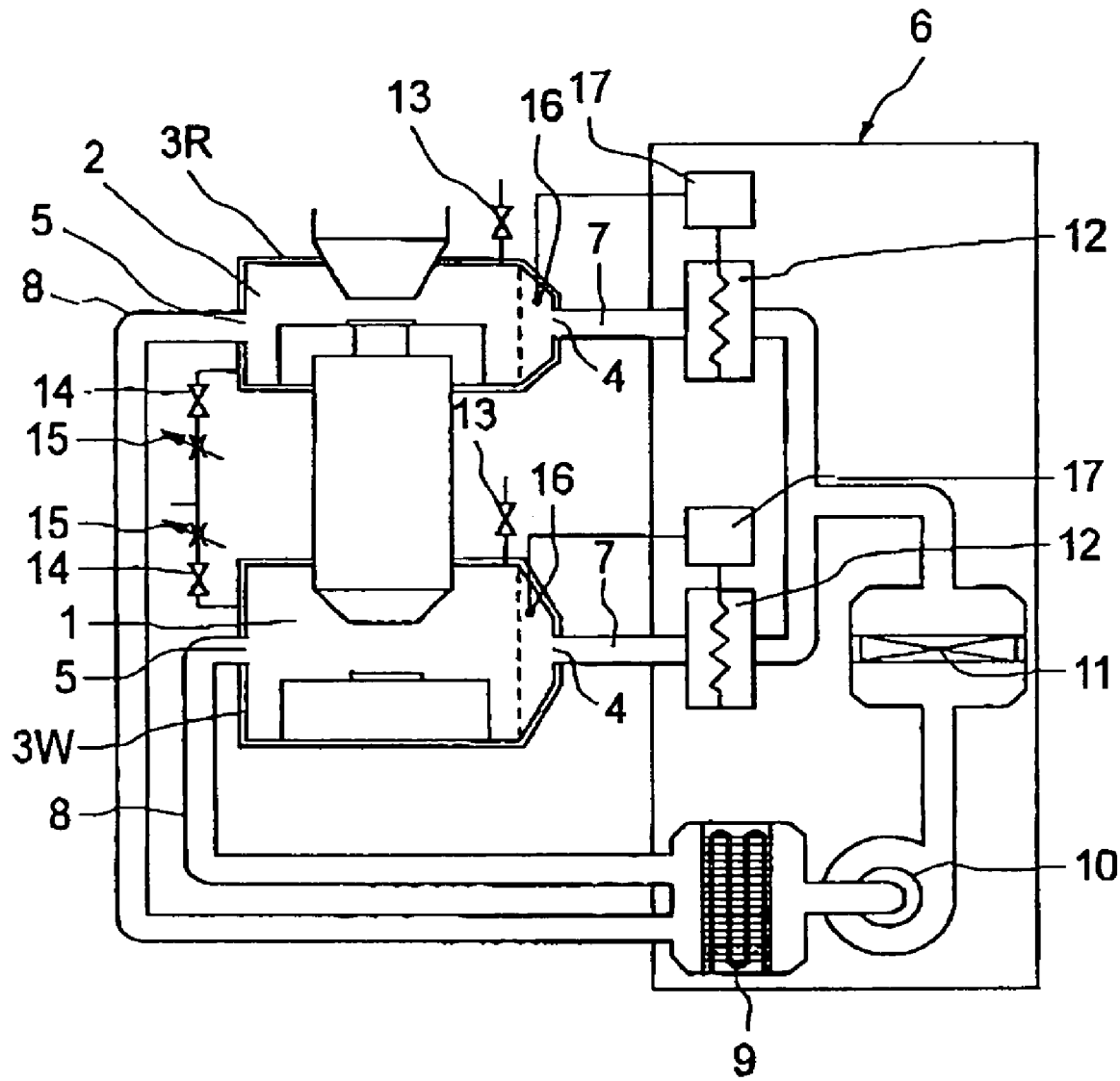
FIG. 5 is a schematic view of a conventional inert gas circulating system.

The exposure apparatus shown in FIG. 1 has the same structure as that (of a conventional inert gas circulating system) shown in FIG. 5, except that it further includes temperature sensors 18, 19 and 24, a heater gradient control portion 20, a heater 22 for a coolant, and a gradient control mechanism 23. In FIG. 1, members and means are indicated by reference numerals identical to those shown in FIG. 5 and a detailed explanation thereof will be omitted. Incidentally, a chiller 21, a pump 25, and a heat exchanger 26, are not shown in FIG. 5, but are used in common with the conventional inert gas circulating system.

In the exposure apparatus shown in FIG. 1, temperature control of the inert gas is performed by detecting the temperature of inert gas through the temperature sensors 18 and 16, inputting their signals into the heater gradient control portion 20, performing gradient control on the basis of a difference between an internal circulation temperature and a target set temperature, and outputting a resultant signal to the temperature control device 17 to effect control of the heating device (temperature control heater) 12.

Further, also with respect to the cooling of the inert gas, the gradient control is performed by detecting the inert gas temperature by use of the temperature sensors 19 and 24, and inputting their signals into the gradient control mechanism 23 in the chiller 21, on the basis of a difference between a circulation temperature and a target set temperature. A resultant signal is outputted to the temperature control device 17 to control the heater 22 for the coolant. The cooling rate of the inert gas is controlled by effecting gradient control of the coolant.

Here, mechanisms of occurrence and suppression of the internal pressure change will be described by taking the case wherein the inert gas temperature is increased as an example.

Figure 6:
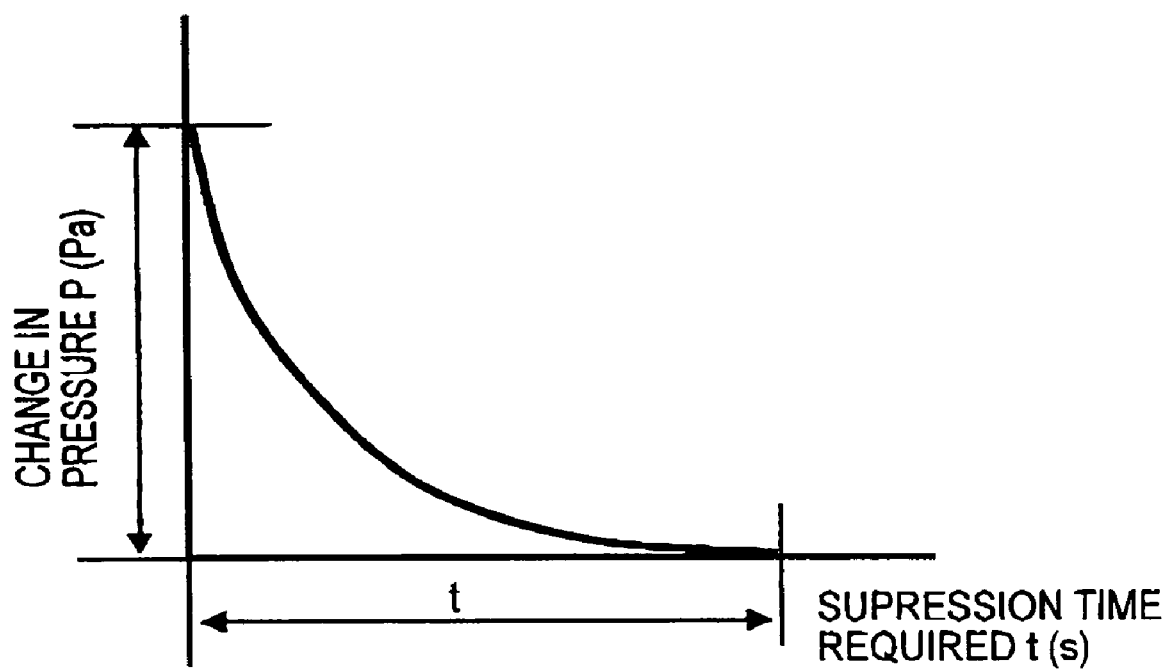
FIG. 6 is a graph showing a relationship between a change in internal pressure and a time required to suppress the internal pressure change.

In this case, a circulating system is not a complete closed circulating system, thus, permitting supply and exhaust of gas. Accordingly, a predetermined change in internal pressure can be suppressed by a certain period of time. Such a relationship therebetween is shown in FIG. 6. Referring to FIG. 6, a time required to suppress a certain internal pressure change ΔP when the internal pressure changes ΔP occurs is taken as t. A relationship (time constant) therebetween is determined by a volume of the circulating system, an exhaust flow rate, and a resistance at an exhaust port.

On the basis of this relationship, a time t required to suppress the predetermined internal pressure change ΔP is determined.

Further, from an equation of the state of the gas, ΔP, which is increased by a temperature rise ΔT, is determined. When a time required for the temperature rise is equal to or longer than the time t required to suppress the internal pressure change described above, it is possible to suppress the internal pressure change in an acceptable range. As described above, it becomes possible to determine such a temperature gradient (temperature changing rate or timewise changing rate) that the internal pressure change does not occur. Accordingly, when the gradient control mechanism 20 generates a target temperature value varying depending on the temperature gradient determined, as described above, on the basis of a difference between a target temperature set value of gas and a measured temperature value (a measured value by the temperature sensor 16) and (on the basis of) a measured temperature value (a measured value by the temperature sensor 18) disposed upstream of the heating device 12, and provides the generated target temperature value to the temperature control device 17, it is possible to suppress the internal pressure change of the chamber in an acceptable range thereof.

According to this embodiment, by controlling the temperature rise (heating) or cooling rate gradient while monitoring the circulation temperature in the purge chamber, it becomes possible to suppress the change in internal pressure of the purge chamber while avoiding an abrupt temperature rise state or a radial cooling state of the circulation gas to ensure a withstanding pressure of the lens.

In this embodiment, the gradient control portion and the temperature control device are independently disposed, but they may be constituted as an integrated control mechanism.

Embodiment 2

Figure 2:
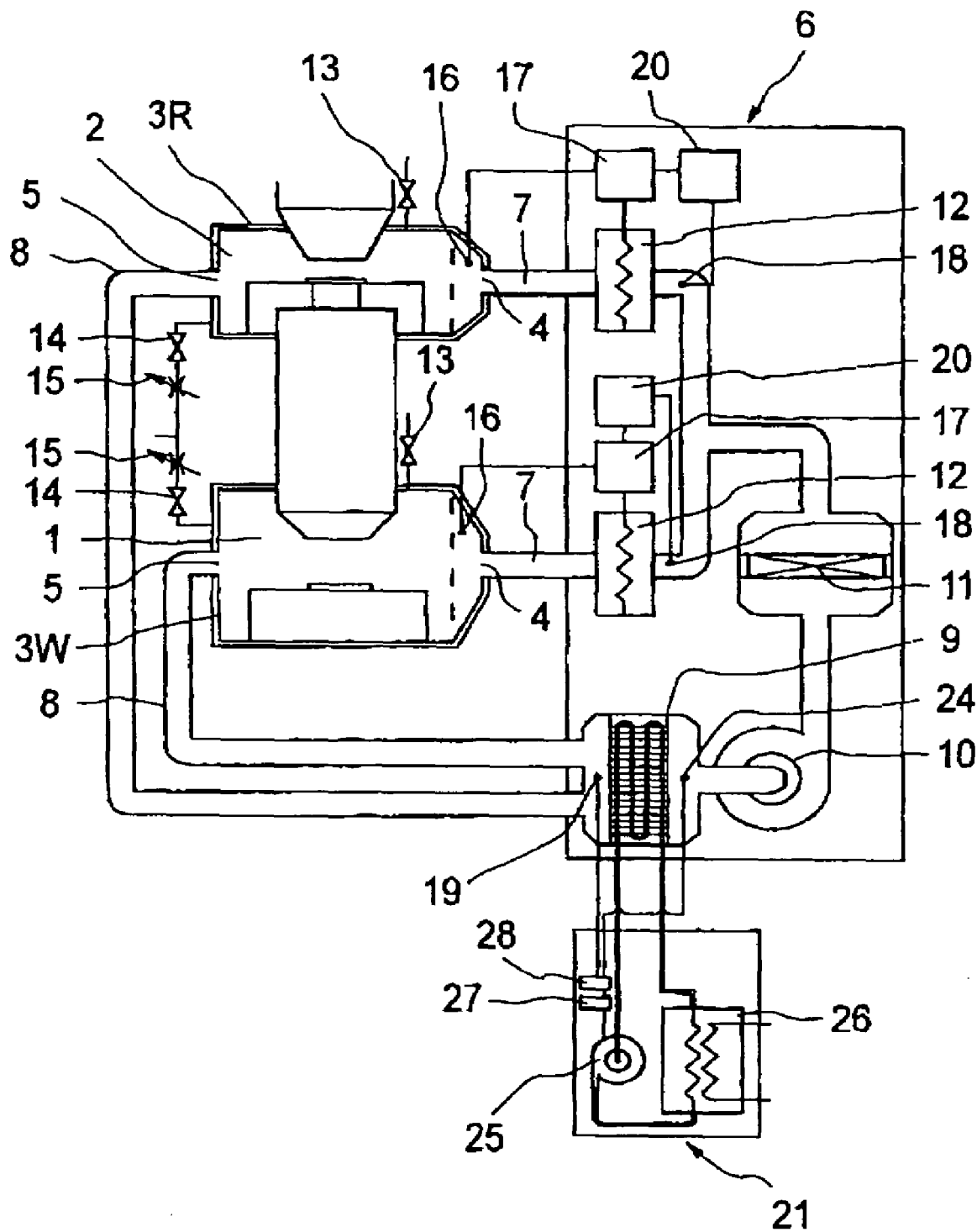
FIG. 2 is a schematic view of another embodiment of the exposure apparatus of the present invention.

FIG. 2 is a schematic view of an exposure apparatus in this embodiment according to the present invention.

The exposure apparatus shown in FIG. 2 has the same structure as that (of a conventional inert gas circulating system) shown in FIG. 5, except that it further includes temperature sensors 18, 19 and 24, an inverter 27, and a gradient control mechanism 28. In FIG. 2, members and means are indicated by reference numerals identical to those shown in FIG. 5 and FIG. 1 and a detailed explanation thereof will be omitted.

The exposure apparatus of this embodiment has the same function as that of Embodiment 1, except that cooling rate control at a cooling portion is performed by controlling the inverter 27 in a chiller 21 to regulate the number of revolutions of a pump 25, thereby to effect flow rate control of a coolant to control a gradient of the cooling rate.

In the exposure apparatus shown in FIG. 2, temperature control of inert gas is performed by detecting the temperature of inert gas through the temperature sensors 18 and 16, inputting their signals into the heater control portion 20, performing gradient control on the basis of a difference between an internal circulation temperature and a target set temperature, and outputting a resultant signal to the temperature control device 17 to effect control of the heating device 12.

Further, also with respect to the cooling of the inert gas, the gradient control is performed by detecting the inert gas temperature by use of the temperature sensors 19 and 24, and inputting their signals into the gradient control mechanism 28 on the basis of a difference between a circulation temperature and a target set temperature. As a gradient control method in this embodiment, the number of revolutions of the pump is controlled by the inverter 27 for the pump 25 in the chiller 21, whereby gradient control of a cooling rate is performed through flow rate control of the coolant.

As described above, this embodiment is identical to that of Embodiment 1 except that the gradient control of the cooling device is performed by the flow rate of the coolant. As a result, according to this embodiment, by controlling the temperature rise rate and/or the cooling rate, the internal pressure changes in the purge chamber is suppressed to ensure a withstanding pressure of the lens.

According to this embodiment, by suppressing a possible change in internal pressure of the purge chamber due to an abrupt temperature rise state or a radial cooling state of the circulation gas during a start and stop of the circulation operation and controlling the temperature rise (heating) or cooling rate gradient while monitoring the circulation temperature in the purge chamber, it becomes possible to ensure withstanding a pressure of the lens.

Embodiment 3

A device manufacturing method, utilizing the exposure apparatus described above, according to this embodiment of the present invention, will be described.

Figure 3:
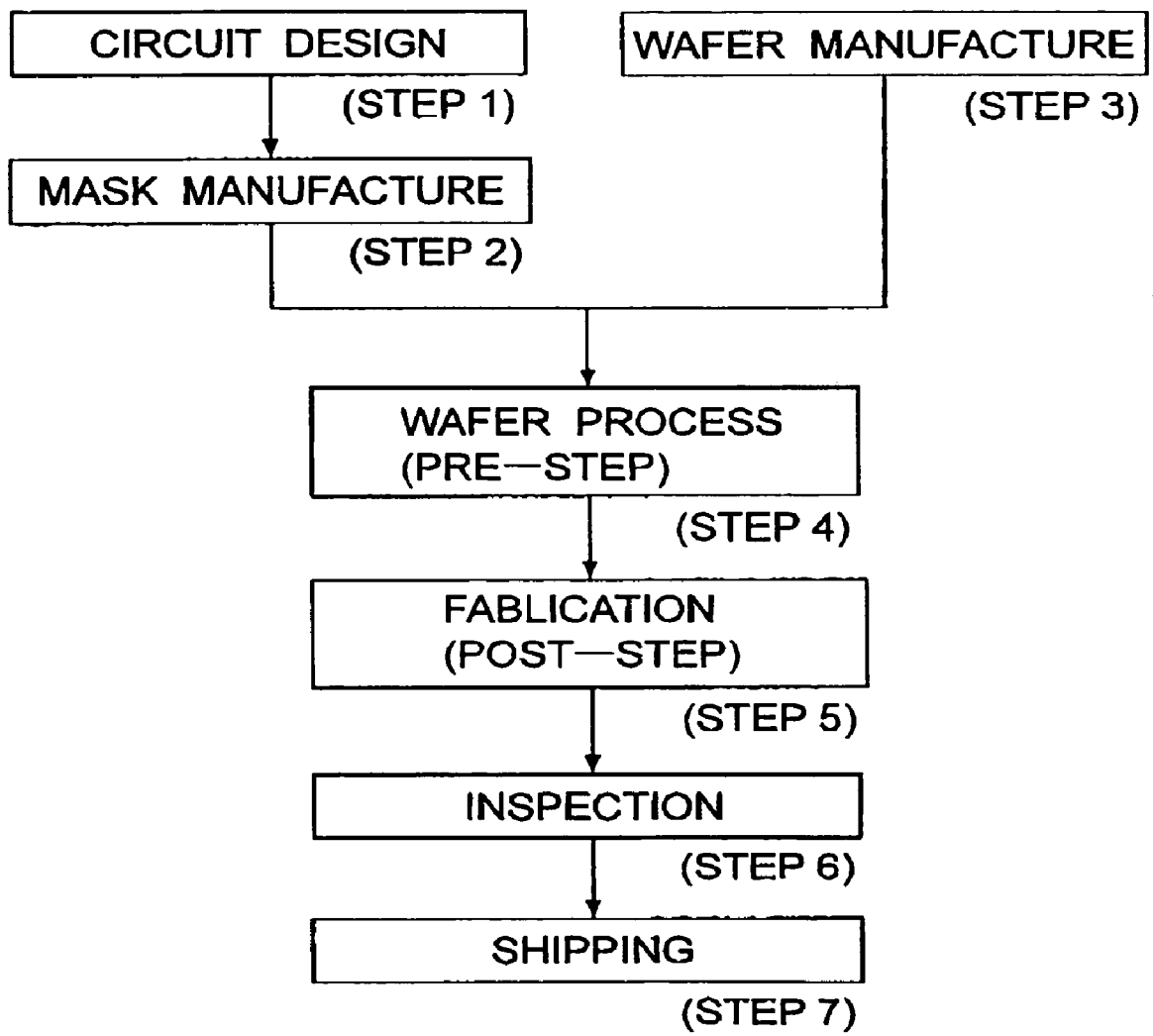
FIG. 3 is a flow chart showing a procedure of device manufacture.

FIG. 3 shows a flow chart of the manufacture of microdevices (such as semiconductor chips (ICs, LSIs, etc.), a liquid crystal panel, a CDD, a thin film magnetic head, and a micromachine).

In Step 1 (circuit design), pattern designing of a device is performed. In step 2 (mask manufacture), a mask provided with the designed pattern is manufactured. On the other hand, in Step 3 (wafer manufacture), a wafer is manufactured by use of a material such as silicon or glass. Step 4 (wafer process) is referred to as a pre-step, in which the above-prepared mask and wafer are used to form an actual circuit on the wafer through lithography. A subsequent step, Step 5 (fabrication), is referred to as a post-step, in which the circuit-formed wafer is fabricated in a semiconductor ship, and includes an assembly step (dicing and bonding), a packaging step (chip sealing), etc. In Step 6 (inspection), the semiconductor device fabricated in Step 5 is subjected to inspections such as an operation check, a durability test, etc. Through the steps described above, the semiconductor device is finished and then is shipped (Step 7).

Figure 4:
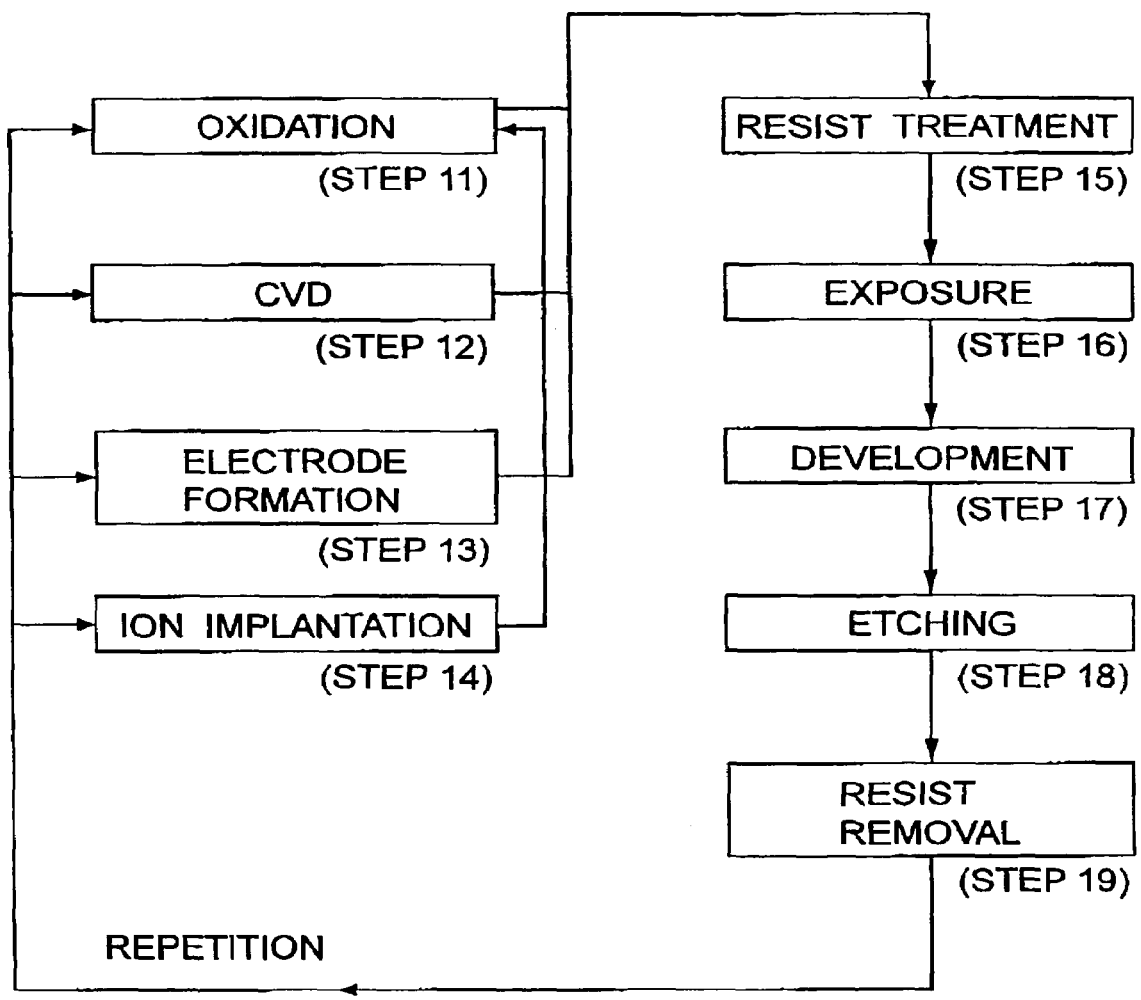
FIG. 4 is a flow chart showing a detailed procedure of a wafer process shown in FIG. 3.

FIG. 4 shows a flow chart of a detailed wafer step (Step 3 in FIG. 3).

In Step 11 (oxidation), the surface of a wafer is oxidized. In Step 12 (CVD), an insulating film is formed on the wafer surface through CVD. In Step 13 (electrode formation), an electrode is formed on the wafer by (vacuum) vapor deposition. In Step 14 (ion implantation), ions are implanted in the wafer. In Step 15 (resist treatment), a photosensitive agent is applied onto the wafer. In Step 16 (exposure), the circuit pattern of the mask is transferred onto the wafer by exposure through the above-described exposure apparatus. In Step 17 (development), the exposed wafer is subjected to development. In Step 18 (etching), a portion other than the developed resist image is removed. In Step 19 (resist removal), the unnecessary resist after completion of the etching is removed. These steps are repetitively performed to form a multiple circuit pattern. By using the device manufacturing method of the present invention, it is possible to inexpensively manufacture a highly-integrated device, which has not been manufactured readily by a conventional device manufacturing method.

As described hereinabove, according to the above-described embodiments of the present invention, by providing the temperature gradient control means for controlling the temperature gradient during a period in which the temperature in the chamber is changed, particularly, during a start and/or a stop of operation of an air conditioning system, it is possible to prevent an abrupt pressure change in the chamber. As a result, it becomes possible to prevent deterioration or damage of an apparatus constitutional element, such as a lens, thereby to improve a reliability of the exposure apparatus.

While the invention has been described with reference to the structures disclosed herein, it is not confined to the details set forth and this application is intended to cover such modification or changes as may come within the purposes of the improvements or the scope of the following claims.

This application claims priority from Japanese Patent Application No. 377657/2003 filed Nov. 7, 2003, which is hereby incorporated by reference.

What is claimed is:

1. An exposure apparatus having a projection optical system and configured to expose a substrate to light via a pattern of a mask and the projection optical system, said apparatus comprising:
    a chamber configured to hermetically contain at least part of the projection optical system;
    a circulating system including a blower configured to send an inert gas to said chamber and a temperature regulator configured to regulate a temperature of the inert gas, said circulating system configured to circulate the inert gas through said chamber;
    a temperature sensor configured to detect the temperature of the inert gas at a position downstream of the temperature regulator; and
    a controller configured to control the temperature regulator on the basis of a target temperature in said chamber and a detection result of said temperature sensor,
    wherein said controller is configured to change the target temperature so that a timewise temperature gradient of the inert gas falls within an acceptable range, the acceptable range being determined so that a timewise change in pressure in said chamber caused by a timewise change in temperature of the inert gas is within an acceptable range.

2. An apparatus according to claim 1, wherein the acceptable range of the timewise change in pressure is associated with a pressure-resistant range of the projection optical system.

3. An apparatus according to claim 1, wherein the timewise temperature gradient represents a change in temperature changing rate.

4. An apparatus according to claim 3, wherein the acceptable range of the timewise change in pressure is determined by at least one of a volume of said chamber and a flow rate of the circulated inert gas.

5. An apparatus according to claim 1, wherein the temperature regulator comprises a cooler and a heater, and said circulating system comprises a filter disposed on a path of the circulated gas from the cooler to the heater.

6. A method of manufacturing a device, said method comprising steps of:
    exposing a substrate to light via a pattern of a mask and a projection optical system using an exposure apparatus having (i) a chamber configured to hermetically contain at least a part of the projection optical system, (ii) a circulating system including a blower configured to send an inert gas to the chamber and a temperature regulator configured to regulate a temperature of the inert gas, the circulating system being configured to circulate the inert gas through the chamber, (iii) a temperature sensor configured to detect the temperature of the inert gas at a position downstream of the temperature regulator, and (iv) a controller configured to control the temperature regulator on the basis of a target temperature in the chamber and a detection result of the temperature sensor, wherein the controller is configured to change the temperature so that a timewise temperature gradient of the inert gas falls within an acceptable range, the acceptable range being determined so that a timewise change in temperature of the inert gas is within an acceptable range;
    developing the exposed substrate; and
    processing the developed substrate in order to manufacture the device.

* * * * *